(12) United States Patent
Park et al.

(10) Patent No.: US 8,049,240 B2
(45) Date of Patent: Nov. 1, 2011

(54) DUAL EMISSION ORGANIC LIGHT EMITTING DISPLAY DEVICE AND METHOD OF DRIVING THE SAME

(75) Inventors: Jin-Woo Park, Suwon-si (KR); Won-Kyu Kwak, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/690,016

(22) Filed: Jan. 19, 2010

(65) Prior Publication Data

US 2010/0118020 A1     May 13, 2010

Related U.S. Application Data

(62) Division of application No. 11/510,051, filed on Aug. 24, 2006, now Pat. No. 7,679,093.

(30) Foreign Application Priority Data

Aug. 26, 2005 (KR) ........................ 10-2005-0078758

(51) Int. Cl.
    *H01L 33/00*    (2010.01)
(52) U.S. Cl. ....................................................... 257/98
(58) Field of Classification Search ............... 257/98
    See application file for complete search history.

(56) References Cited

U.S. PATENT DOCUMENTS

2004/0066358 A1    4/2004   Numao
2004/0227764 A1   11/2004   Endo

FOREIGN PATENT DOCUMENTS

KR      2002-0097420     12/2002

OTHER PUBLICATIONS

Korean Patent Abstracts for Publication No. 1020020097420 A; Date of Publication of Application Dec. 31, 2002 in the name of Heum Il Baek, et al.

*Primary Examiner* — Kenneth Parker
*Assistant Examiner* — Anthony Ho
(74) *Attorney, Agent, or Firm* — Christie, Parker & Hale, LLP

(57) ABSTRACT

A dual emission organic light emitting display device and method of driving the same. The display device includes a pixel driver and an organic light emitting diode that can display different images on a top surface and a bottom surface and/or a same image on both the top and bottom surfaces. The display device includes a top/bottom selector that receives a driving current from the pixel driver and selectively supplies the driving current to a top organic light emitting diode or a bottom organic light emitting diode. The top/bottom selector includes transistors, which are connected between the pixel driver and the organic light emitting diode and select a top emission operation or a bottom emission operation. Here, the circuit configuration of the pixel driver is reduced so that the dual emission organic light emitting display device can be improved in terms of a layout, an interconnection, and an aperture ratio.

11 Claims, 6 Drawing Sheets

DUAL EMISSION ORGANIC LIGHT EMITTING DISPLAY DEVICE AND METHOD OF DRIVING THE SAME

CROSS-REFERENCE TO RELATED APPLICATION

This application is a divisional of U.S. patent application Ser. No. 11/510,051, filed Aug. 24, 2006, which claims priority to and the benefit of Korean Patent Application No. 10-2005-0078758, filed Aug. 26, 2005, the entire content of both of which is incorporated herein by reference.

BACKGROUND OF THE INVENTION

1. Field of the Invention

The present invention relates to a dual emission organic light emitting display device, and more particularly, to a dual emission organic light emitting display device that can display different images on a top surface and a bottom surface and/or a same image on the top surface and the bottom surface using a single pixel driver, and a method of driving the same.

2. Description of the Related Art

An organic light emitting display device is an emissive display in which light is created by electrically exciting organic compounds. That is, the organic light emitting display device includes an organic light emitting diode having an organic emission layer interposed between an anode and a cathode. Thus, holes supplied from the anode combine with electrons supplied from the cathode in the organic emission layer to form hole-electron pairs, i.e., excitons. When the excitons transition from an exited state to a ground state, energy is generated so that the organic light emitting diode emits light.

In general, the organic light emitting display device can be classified into a passive matrix type and an active matrix type depending on a method of driving N×M pixels that are arranged in a matrix shape.

The passive matrix type can be fabricated by arranging anodes and cathodes in a matrix shape on a display region.

By contrast, in the active matrix type, a thin film transistor (TFT) is disposed on each pixel of a display region. Thus, a constant amount of current can be supplied to an organic light emitting diode irrespective of the number of pixels so that the active matrix type can emit light with uniform luminance. Also, since the active matrix type consumes less power than the passive matrix type, it can be applied to high-resolution large-sized display devices.

Also, the organic light emitting display device can be categorized into a bottom-emitting type and a top-emitting type depending on the direction in which light generated from an organic emission layer is emitted.

In the bottom-emitting type, light generated from an organic emission layer is emitted toward a glass substrate. The bottom-emitting type includes a reflective layer (for a cathode) disposed on the organic emission layer and a transparent electrode (for an anode) disposed under the organic emission layer. Here, in the active matrix type, since a portion where a TFT is formed does not transmit light, the light emitting area can be reduced.

By contrast, in the top-emitting type, a transparent electrode (for a cathode) is disposed on an organic emission layer, and a reflective layer (for an anode) is disposed under the organic emission layer. Here, since light generated from the organic emission layer is emitted in a direction opposite to the substrate, the area or portion that that transmits light can increase, thereby increasing the luminance of the organic light emitting display device.

A dual emission organic light emitting display device is an organic light emitting display device in which a top-emitting type and a bottom-emitting type are formed on a single substrate.

Typically, the dual emission organic light emitting display devices can be categorized into first, second, and third types.

The first type employs a transmissive light emitting device structure so that the same image is displayed on both surfaces. However, since this first type displays the same image on both surfaces, it can only be applied to a few number of applications.

The second type includes two bottom-emitting substrates that are brought into contact with each other, so that different images are displayed on both surfaces. However, in the second type, although different images can be displayed on both surfaces, its production cost is high (doubled), and it is difficult to encapsulate such a device, thereby lowering its reliability.

In the third type, a single substrate is divided into a top emission region and a bottom emission region so that the top emission region and the bottom emission region can be separately driven. However, the third type allows an image to be only partially displayed on both surfaces.

SUMMARY OF THE INVENTION

An aspect of the present invention provides a dual emission organic light emitting display device that can display different images on a top surface and a bottom surface and/or the same image on the top surface and the bottom surface using a single pixel driver, and a method of driving the same.

In an exemplary embodiment of the present invention, a dual emission organic light emitting display device includes: a pixel driver adapted to receive a top emission data signal for a first sub-frame of one frame, to receive a bottom emission data signal for a second sub-frame of the one frame, and to generate a top driving current and a bottom driving current; a top/bottom selector adapted to receive the top driving current and the bottom driving current from the pixel driver and to selectively supply the top driving current and the bottom driving current in response to a top emission control signal and a bottom emission control signal; and a dual emission organic light emitting diode adapted to receive one of the top driving current or the bottom driving current, to emit light through a top surface for the first sub-frame, and to emit light through a bottom surface for the second sub-frame.

In another exemplary embodiment of the present invention, a dual emission organic light emitting display device includes: a pixel driver adapted to generate a driving current in response to a data signal; a top/bottom selector adapted to receive the driving current from the pixel driver and to selectively supply the driving current in response to a top/bottom selection signal; and a dual emission organic light emitting diode adapted to selectively receive the driving current from the top/bottom selector and to emit light through one of a top surface or a bottom surface.

In yet another exemplary embodiment of the present invention, a dual emission organic light emitting display device includes: a top organic light emitting diode having a top first electrode formed with a top reflective layer, an organic layer, and a second electrode, the organic layer being stacked between the top first electrode and the second electrode; a bottom organic light emitting diode having a bottom first electrode, the organic layer, and a second electrode formed with a bottom reflective layer, the organic layer being stacked also between the bottom first electrode and the second electrode; and a pixel driver electrically connected to both the top first electrode and the bottom first electrode and adapted to selectively supply a driving current to the top first electrode and the bottom first electrode.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

Embodiment 1

Figure 1:
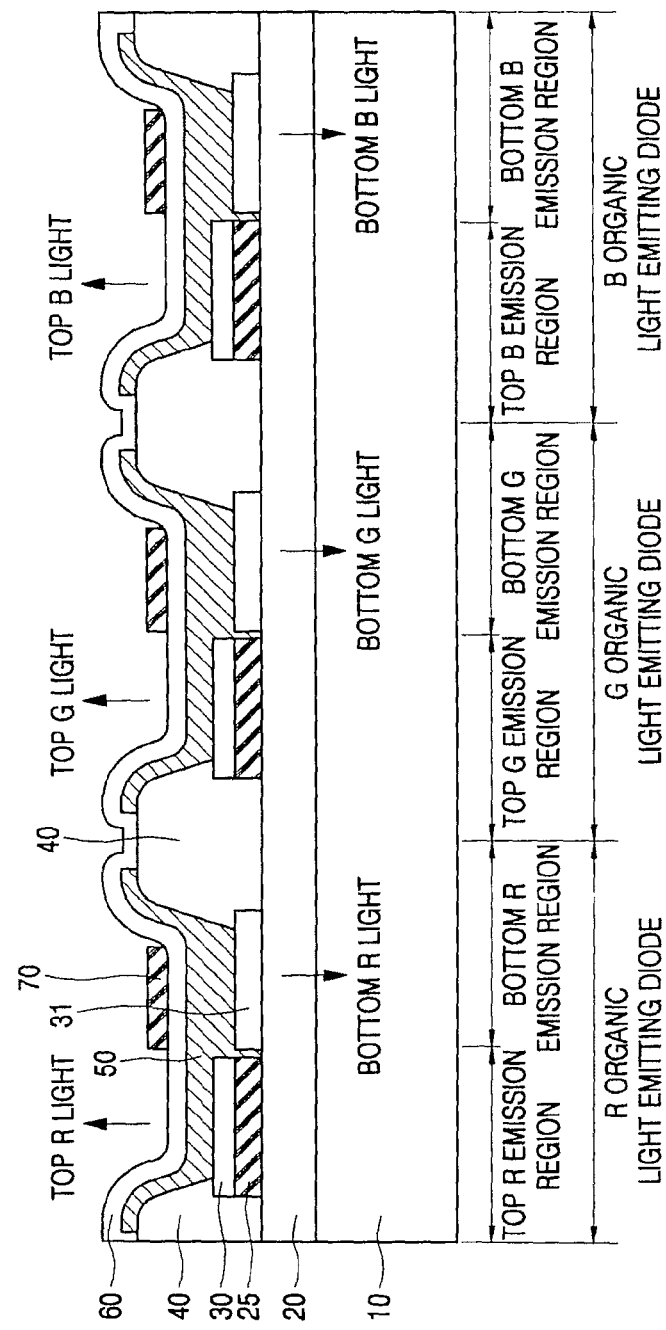
FIG. 1 is a cross-sectional view illustrating a process of fabricating red (R), green (G), and blue (B) organic light emitting diodes (OLEDs) of a dual emission organic light emitting display device according to an embodiment of the present invention.

FIG. 1 is a cross-sectional view illustrating a process of fabricating red (R), green (G), and blue (B) organic light emitting diodes (OLEDs) of a dual emission organic light emitting display device according to an embodiment of the present invention.

Here, only a process of fabricating an R OLED will be described in detail for ease of explanation, and it should be understood by those skilled in the art that G and B OLEDs can be fabricated with substantially the same process.

Referring to FIG. 1, the R OLED is a dual emission R OLED and is divided into a top R emission region and a bottom R emission region.

The dual emission R OLED includes a glass substrate 10 on which thin film transistors (TFTs) (e.g., as show in FIG. 2) are formed to generate a driving current. The TFTs supply the driving current to the R OLED such that the dual emission R OLED emits light. The TFTs include a semiconductor layer formed by a low temperature polysilicon (LTPS) process. Also, the TFTs are formed in the top R emission region.

A planarization layer 20 is formed on the entire surface of the glass substrate 10, and a top reflective layer 25 is patterned on the planarization layer 20 formed in the top R emission region. The top reflective layer 25 is formed of Al(Nd) or Ag, preferably, Al(Nd). The top reflective layer 25 is formed by a sputtering process or an ion plating process. The formation of the top reflective layer 25 includes depositing, for example, an Al(Nd) layer, forming a photoresist (PR) pattern by a photolithography process, and selectively removing the Al(Nd) layer by an etching process using the PR pattern as an etch mask.

Thereafter, a top first electrode 30 is patterned on the top reflective layer 25 in the top R emission region, and a bottom first electrode 31 is patterned on the planarization layer 20 in the bottom R emission region. When the top first electrode 30 and the bottom first electrode 31 are anodes, they may be transparent electrodes formed of a material having a high work function, such as indium tin oxide (ITO) or indium zinc oxide (IZO). When the top first electrode 30 and the bottom first electrode 31 are cathodes, they may be transmissive electrodes formed of a conductive metal having a low work function, e.g., a conductive material selected from the group consisting of Mg, Ca, Al, Ag, and alloys thereof.

Figure 2:
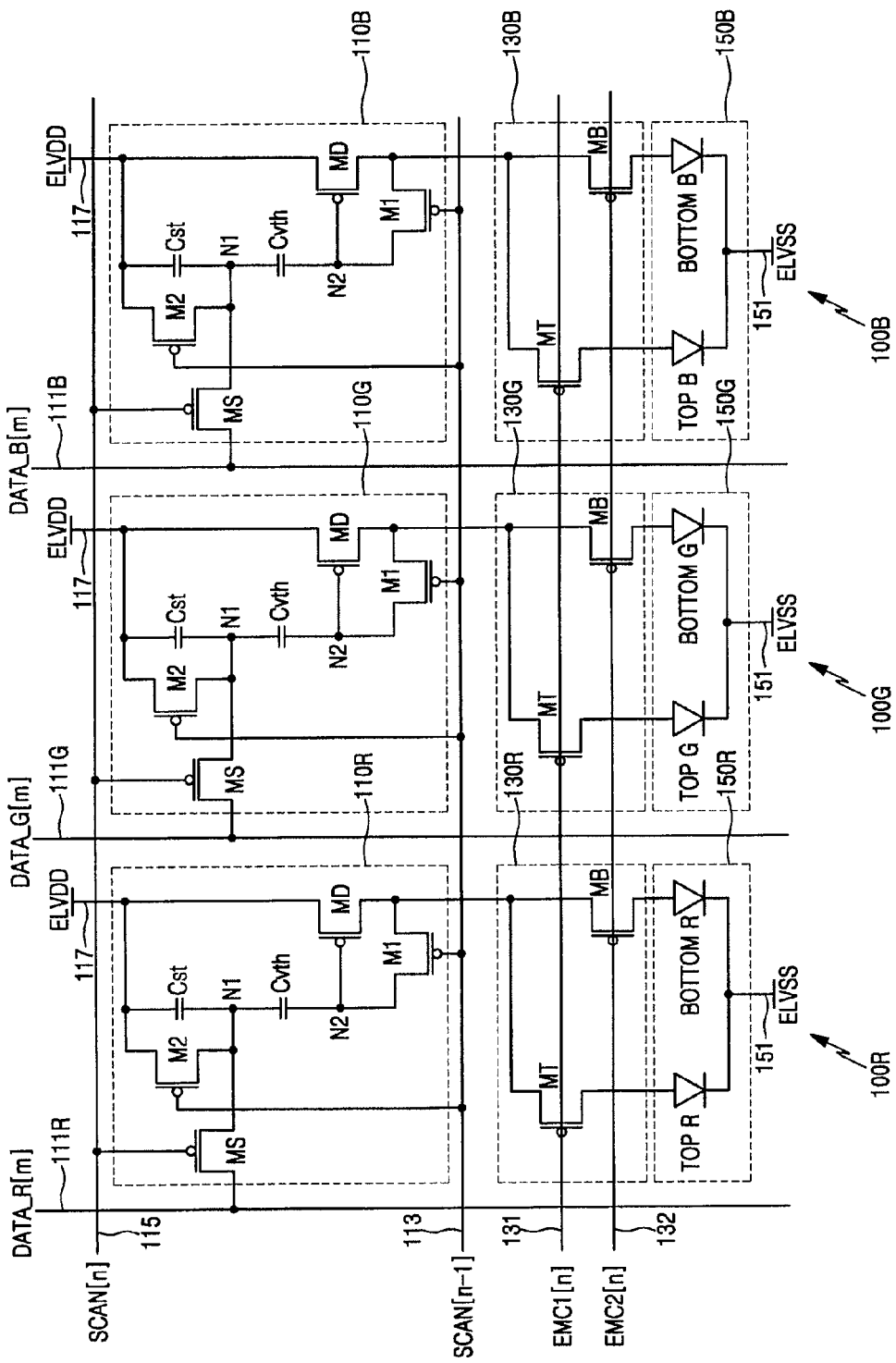
FIG. 2 is a circuit diagram of R, G, and B pixel circuits of the dual emission organic light emitting display device of FIG. 1.

In the dual emission organic light emitting display device of the present embodiment, since different images are displayed on both surfaces using only one pixel driver (e.g., as shown in FIG. 2), the top first electrode 30 is electrically connected to a source/drain (e.g., as shown in FIG. 2) of a top emission transistor through a contact hole, and the bottom first electrode 31 is electrically connected to a source/drain (e.g., as shown in FIG. 2) of a bottom emission transistor through another contact hole. The one pixel driver includes a plurality of TFTs and is formed (e.g., the TFTs are formed) under the top reflective layer 25 in the top R emission region so that the pixel driver does not (or the TFTs do not) affect a bottom emission operation.

As described above, the top first electrode 30 and the top reflective layer 25 are formed in the top R emission region. Thus, the top first electrode 30 formed with the top reflective layer 25 can be a top emission electrode to increase (or maximize) the amount of light emitted toward a top surface. The bottom first electrode 31 formed in the bottom R emission region can be a bottom emission electrode.

In addition, a pixel defining layer 40 is formed on portions of the top first electrode 30 and the bottom first electrode 31 to expose other portions of the top and bottom first electrodes 30 and 31.

An organic layer 50 including at least an organic emission layer (EML) is formed on the exposed portions of the top and bottom first electrodes 30 and 31. The organic layer 50 may include not only the EML but also one or more layers selected from the group consisting of a hole injection layer (HIL), a hole transport layer (HTL), an electron transport layer (ETL), and an electron injection layer (EIL).

The organic layer 50 is deposited by a vacuum evaporation method, a spin coating method, an inkjet printing method, a Doctor blade method, and a laser induced thermal imaging (LITI) method. In addition, the organic layer 50 may be patterned in accordance with red (R), green (G), and blue (B) unit pixels (or sub-pixels) of a display region. The patterning of the organic layer 50 may be performed by an LITI method or a vacuum evaporation method using a shadow mask.

Thereafter, a second electrode 60 is formed on the entire surface of the glass substrate 10 including the organic layer 50. Here, when the top first electrode 30 and the bottom first electrode 31 are anodes, the second electrode 60 may be a transmissive electrode formed of a conductive metal having a low work function, i.e., a material selected from the group consisting of Mg, Ca, Al, Ag, and alloys thereof. When the top first electrode 30 and the bottom first electrode 31 are cathodes, the second electrode 60 may be formed of a transparent electrode such as ITO or IZO. In one embodiment, the second electrode 60 may be formed of an alloy of Mg and Ag. The second electrode 60 may be formed by a vacuum evaporation method or a sputtering process.

A bottom reflective layer 70 is also patterned in the top R emission region. The bottom reflective layer 70 is formed of Al(Nd) or Ag, preferably, Al(Nd). The bottom reflective layer 70 is formed by shifting from the R pixel region to a G pixel region and from the G pixel region to a B pixel region using a fine metal mask (FMM).

Subsequently, the glass substrate 10 including the bottom reflective layer 70 is attached to an encapsulation substrate, thereby completing the dual emission R OLED.

As described above, in the present embodiment, the LTPS process of forming the top reflective layer 25 further includes one mask process (e.g., the etch mask process), and the bottom reflective layer 70 is formed using the FMM, so that a dual emission organic light emitting display device can be realized to display different images on both surfaces.

Also, the dual emission organic light emitting display device according to the present embodiment adopts a time division control (TDC) mode in order to display different images on top and bottom surfaces using one pixel driving circuit.

Hereinafter, a pixel circuit for the dual emission organic light emitting display device according to an embodiment of the present embodiment and a method of driving the same will be described in more detail with reference to FIGS. 2 and 3.

FIG. 2 is a circuit diagram of R, G, and B pixel circuits of the dual emission organic light emitting display device of FIG. 1.

Referring to FIG. 2, one pixel circuit is divided into an R pixel circuit 100R, a G pixel circuit 100G, and a B pixel circuit 100B.

The R pixel circuit 100R includes a pixel driver 110R, a top/bottom selector 130R, and an R OLED 150R.

The pixel driver 110R is enabled in response to a previous scan signal SCAN[n−1] and a current scan signal SCAN[n]. Also, the pixel driver 110R receives a top or bottom R data signal DATA_R[m] from a data line 111R and generates a top driving current or a bottom driving current.

The top/bottom selector 130R allows or cuts off the flow of the top or bottom driving current in response to a top emission control signal EMC1[n] or a bottom emission control signal EMC2[n].

The R OLED 150R is divided into a top R OLED and a bottom R OLED. The top R OLED receives the top driving current selected by the top/bottom selector 130R and emits R light to the top surface, and the bottom R OLED receives the bottom driving current selected by the top/bottom selector 130R and emits R light to the bottom surface.

That is, in each pixel circuit, one frame is divided into a $1^{st}$ sub-frame and a $2^{nd}$ sub-frame. Thus, the top emission data signal is applied to the pixel driver 110R for the $1^{st}$ sub-frame such that the top R OLED emits light, and the bottom emission data signal is applied to the pixel driver 110R for the $2^{nd}$ sub-frame such that the bottom R OLED emits light. Accordingly, one pixel circuit is driven using a TDC method so that different images can be displayed on the top and bottom surfaces for one frame.

The components of the R pixel circuit 100R will now be described in more detail. That is, as shown in FIG. 2, the pixel driver 110R includes four transistors M1, M2, MS, and MD and two capacitors Cst and Cvth. That is, a switching transistor MS is connected between a data line 111R and a node N1, and a current scan line 115 is connected to a gate terminal of the switching transistor MS. Thus, the switching transistor MS is turned on in response to the current scan signal SCAN[n] transmitted from the current scan line 115 and transmits the data signal DATA_R[m].

A driving transistor MD has a first electrode connected to a positive power supply voltage line 117 and a gate terminal connected to a node N2. The driving transistor MD generates a driving current corresponding to a voltage applied to the gate terminal thereof.

A threshold voltage compensation transistor M1 is connected between the gate terminal and a second electrode of the driving transistor MD and has a gate terminal connected to a previous scan line 113. The threshold voltage compensation transistor M1 is turned on in response to the previous scan signal SCAN[n−1] so that the driving transistor MD is diode-connected.

A power supply voltage application transistor M2 is connected between the positive power supply voltage line 117 and the node N1 and has a gate terminal connected to the previous scan line 113. The power supply voltage application transistor M2 is turned on in response to the previous scan signal SCAN[n−1] and transmits a positive power supply voltage ELVDD to the node N1.

A first capacitor Cst is connected between the positive power supply voltage line 117 and the node N1 and stores a voltage corresponding to a difference between the positive power supply voltage ELVDD and a data voltage.

A second capacitor Cvth is connected between the node N1 and the gate terminal of the driving transistor MD and stores the threshold voltage of the driving transistor MD.

Here, the transistors M1, M2, MS, and MD of the pixel driver 110R are shown as p-type metal oxide semiconductor field effect transistors (MOSFETs) (hereinafter, PMOS transistors or p-type charge carrier transistors). However, the present invention is not thereby limited. For example, the pixel driver 110R may be configured with NMOS transistors (or n-type charge carrier transistors). Also, a circuit configuration of the pixel driver 110R is not limited to four transistors and two capacitors, and embodiments of the present invention may have any suitable configuration that can supply a driving current.

An operation of the pixel driver 110R will now be described in more detail. Here, when the previous scan signal SCAN[n−1] is at a low level, the threshold voltage compensation transistor M1 and the power supply voltage application transistor M2 are turned on. Thus, a positive power supply voltage ELVDD is applied to the node N1, and the driving transistor MD is diode-connected, so that a voltage of ELVDD−|Vth$_{MD}$|[V] is applied to the node N2. Accordingly, the second capacitor Cvth stores the same voltage as a threshold voltage Vth.

Next, when the current scan signal SCAN[n] is at a low level, the switching transistor MS is turned on and transmits a data voltage Vdata to the node N1. Here, since the second capacitor Cvth retains the same voltage as the threshold voltage Vth, a voltage of the node N2 (i.e., a gate voltage of the driving transistor MD) becomes ELVDD−|Vth$_{MD}$|−(ELVDD−Vdata) [V].

Therefore, a driving current supplied from the driving transistor MD to the top or bottom R OLED can be expressed by Equation 1:

$$I_{ROLED} = k(Vsg_{MD} - |Vth_{MD}|)^2 = k(ELVDD - (Vdata - |Vth_{MD}|) - |Vth_{MD}|)^2 = k(ELVDD - Vdata)^2 \quad (1),$$

where k is a constant, ELVDD is the positive power supply voltage, Vdata is a gray level data voltage, and Vth$_{MD}$ is the threshold voltage of the driving transistor MD.

Referring still to FIG. 2, the top/bottom selector 130R includes two transistors MT and MB. That is, a top emission transistor MT is connected between the second electrode of the driving transistor MD and the anode of the top R OLED and has a gate terminal connected to a top emission control line 131. The top emission transistor MT is turned on/off in response to the top emission control signal EMC1[n] and allows or cuts off the flow of the driving current supplied from the driving transistor MD.

A bottom emission transistor MB is connected between the second electrode of the driving transistor MD and the anode of the bottom R OLED and has a gate terminal connected to a bottom emission control line 132. The bottom emission transistor MB is turned on/off in response to the bottom emission control signal EMC2[n] and allows or cuts off the flow of the driving current supplied from the driving transistor MD.

Here, the on/off operations of the top emission transistor MT and the bottom emission transistor MB are complementary to each other. In other words, the top emission transistor MT is turned on when the bottom emission transistor MB is turned off for the top emission frame of one frame, so that the top R OLED emits light. Similarly, the top emission transistor MT is turned off when the bottom emission transistor MB is turned on for the bottom emission frame of the one frame, so that the bottom R OLED emits light.

Here, the top and bottom emission transistors MT and MB of the top/bottom selector 130R are PMOS transistors.

Also, although the top/bottom selector 130R is shown to include two PMOS transistors in the present embodiment, the present invention is not thereby limited. For example, the top/bottom selector 130R may include two NMOS transistors, or a PMOS transistor and an NMOS transistor.

Referring still to FIG. 2, the R OLED 150R includes the top R OLED and the bottom R OLED.

That is, in one embodiment, as described with reference to FIG. 1, the top R OLED includes the top first electrode 30, which is an anode formed with the top reflective layer 25, the organic layer 50, and the second electrode 60, which is a cathode. Here, the anode (or the top first electrode) 30 of the top R OLED is connected to a second electrode of the top emission transistor MT, and the cathode (or the second electrode) 60 is connected to a negative power supply voltage line (e.g., a reference or ground power supply voltage line) 151.

Also, in one embodiment, as described with reference to FIG. 1, the bottom R OLED includes the bottom first electrode 31, which is an anode, the organic layer 50, and the second electrode 60, which is a cathode formed with the bottom reflective layer 70. The anode (or the bottom first electrode) 31 of the bottom R OLED is connected to a second electrode of the bottom emission transistor MB, and the cathode (or the second electrode) 60 is connected to the negative power supply voltage line 151.

Accordingly, a top R OLED and a bottom R OLED have an R organic emission layer (e.g., the organic layer 50) in common and time-divide one frame so that different images can be displayed on the top surface and the bottom surface.

As described above, the dual emission organic light emitting display device of the present embodiment includes a single pixel driver and a single OLED (e.g., having a top OLED and a bottom OLED with a shared organic layer) and drives the OLED using a TDC method, and thus different images can be displayed on the top and bottom surfaces for one frame.

A method of sequentially driving the top and bottom surfaces of the above-described organic light emitting display device using a TDC method will now be described in more detail with reference to FIG. 3.

Figure 3:
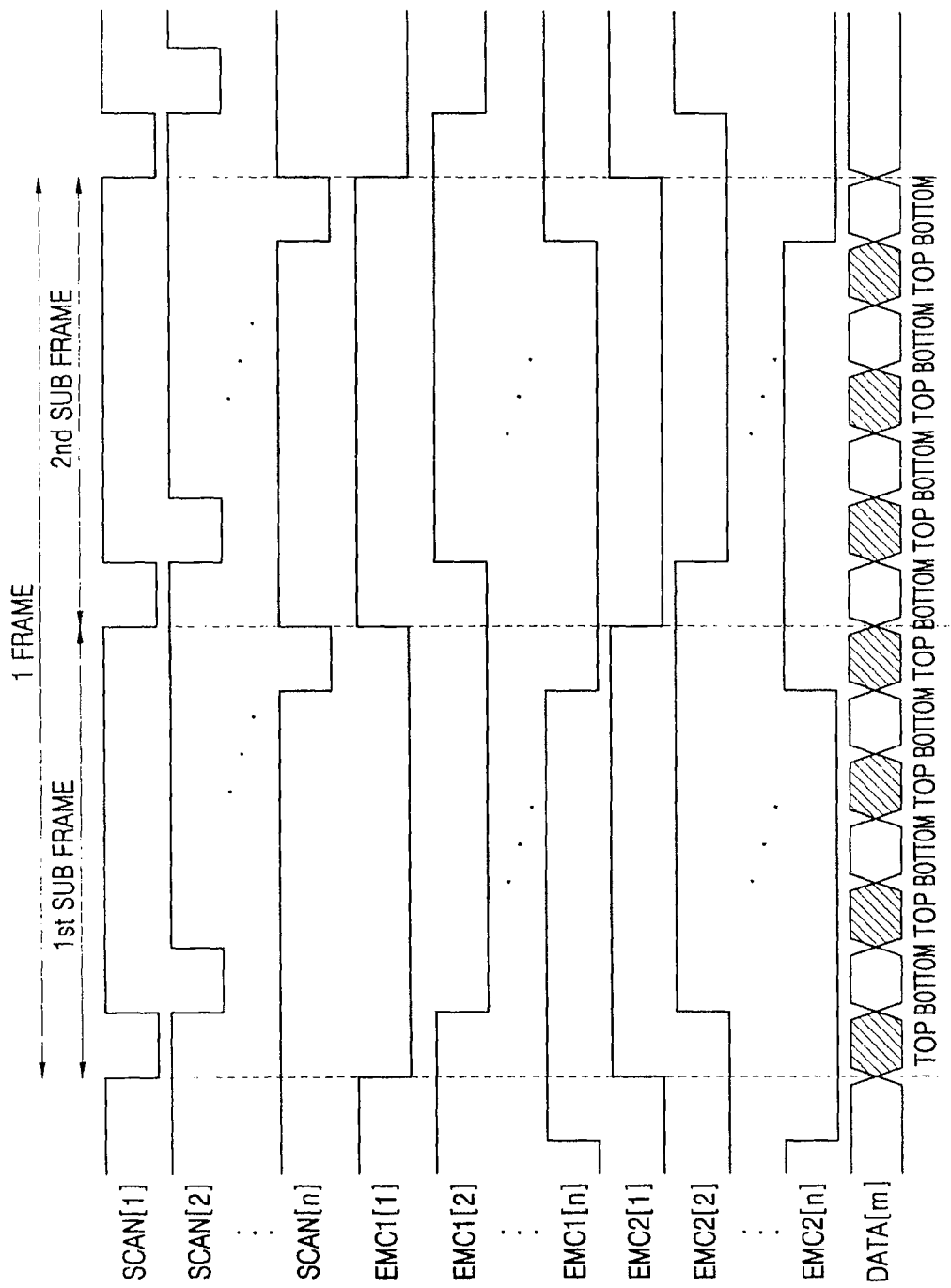
FIG. 3 is a timing diagram illustrating a method of driving the pixel circuit of FIG. 2.

FIG. 3 is a timing diagram illustrating a method of driving the pixel circuit of FIG. 2.

One frame is divided into a $1^{st}$ sub-frame and a $2^{nd}$ sub-frame, and it will be assumed that the $1^{st}$ sub-frame is a top emission sub-frame and the $2^{nd}$ sub-frame is a bottom emission sub-frame, but the present invention is not thereby limited. For example, the $1^{st}$ sub-frame may be a bottom emission sub-frame and the $2^{nd}$ sub-frame may be a top emission sub-frame.

Referring to FIG. 3, for the $1^{st}$ sub-frame of one frame, a first scan signal SCAN[1] and first top R, G, and B data signals are applied to R, G, and B pixel drivers 110R, 110G, and 110B in a first row of a display region having red (R), green (G), and blue (B) unit pixels (or sub-pixels). Thus, the R, G, and B pixel drivers 110R, 110G, and 110B generate a first top R driving current, a first top G driving current, and a first top B driving current, respectively.

In this case, a first top emission control signal EMC1[1] of a low level is applied through a top emission control line 131 to R, G, and B top/bottom selectors 130R, 130G, and 130B, and a second bottom emission control signal EMC2[1] of a high level is applied through a bottom emission control line 132 to the R, G, and B top/bottom selectors 130R, 130G, and 130B. Thus, the top emission transistor MT is turned on, and the bottom emission transistor MB is turned off. Also, the first top R, G, and B driving currents are supplied through the top emission transistor MT to the top R OLED, top G OLED, and top B OLED, respectively, so that the top surface of the dual emission organic light emitting display device emits light with a certain (or predetermined) luminance.

Next, for the $2^{nd}$ sub-frame of the one frame, another first scan signal SCAN[1] and first bottom R, G, and B data signals are applied to the R, G, and B pixel drivers 110R, 110G, and 110B in the first row of the display region. Thus, the R, G, and B pixel drivers 110R, 110G, and 110B generate a first bottom R driving current, a first bottom G driving current, and a first bottom B driving current, respectively.

In this case, the first top emission control signal EMC1[1] of a high level is applied through the top emission control line 131 to the R, G, and B top/bottom selectors 130R, 130G, and 130B, and the second bottom emission control signal EMC2[1] of a low level is applied through the bottom emission control line 132 to the R, G, and B top/bottom selectors 130R, 130G, and 130B. Thus, the top emission transistor MT is turned off, and the bottom emission transistor MB is turned on. Also, the first bottom R, G, and B driving currents are supplied through the bottom emission transistor MB to the bottom R OLED, bottom G OLED, and bottom B OLED, respectively, so that the bottom surface of the dual emission organic light emitting display device emits light with a certain (or predetermined) luminance.

Thereafter, for each sub-frame of one frame, a second scan signal SCAN[2] and second top and bottom R, G, and B data signals are applied to R, G, and B pixel drivers 110R, 110G, and 110B in a second row of the display region. Thus, the top emission transistors MT of the top/bottom selectors 130R, 130G, and 130B are turned on for the $1^{st}$ sub-frame, so that top R, G, and B OLEDs in the second row emit light. Also, the bottom emission transistors MB of the top/bottom selectors 130R, 130G, and 130B are turned on for the $2^{nd}$ sub-frame, so that bottom R, G, and B OLEDs in the second row emit light.

The above-described operations are repeated so that an n-th scan signal SCAN[n] and m-th top and bottom R, G, and B data signals are applied to R, G, and B pixel drivers 110R, 110G, and 110B in an n-th row of the display region for each sub-frame of one frame. Thus, the top emission transistors MT of the top/bottom selectors 130R, 130G, and 130B are turned on for the 1st sub-frame, so that top R, G, and B OLEDs in the n-th row emit light. Also, the bottom emission transistors MB of the top/bottom selectors 130R, 130G, and 130B are turned on for the 2nd sub-frame, so that bottom R, G, and B OLEDs in the n-th row emit light.

As described above, one frame is divided into two sub-frames (i.e., the top emission frame and the bottom emission frame), and the top OLED and the bottom OLED are time-divided for the two sub-frames of the one frame and are sequentially driven so that different images are displayed on the top and bottom surfaces.

In this case, although the top and bottom OLEDs are time-divided and sequentially driven, since the top and bottom OLEDs are sequentially driven in a very short amount of time, a user perceives the top and bottom OLEDs to emit light at the same time. Therefore, different images can be independently and normally displayed on the top and bottom surfaces.

In the present embodiment, one OLED is divided into the top OLED and the bottom OLED, which have a pixel driver in common and are driven using a TDC method. As a result, the circuit configuration of the pixel driver is reduced by half, and thus the dual emission organic light emitting display device can be improved in terms of a layout, an interconnection, and an aperture ratio.

Hereinafter, another pixel circuit of a dual emission organic light emitting display device that displays the same image on a top surface and a bottom surface in accordance with another embodiment of the present invention and a method of driving the same will be described.

Embodiment 2

Figure 4:
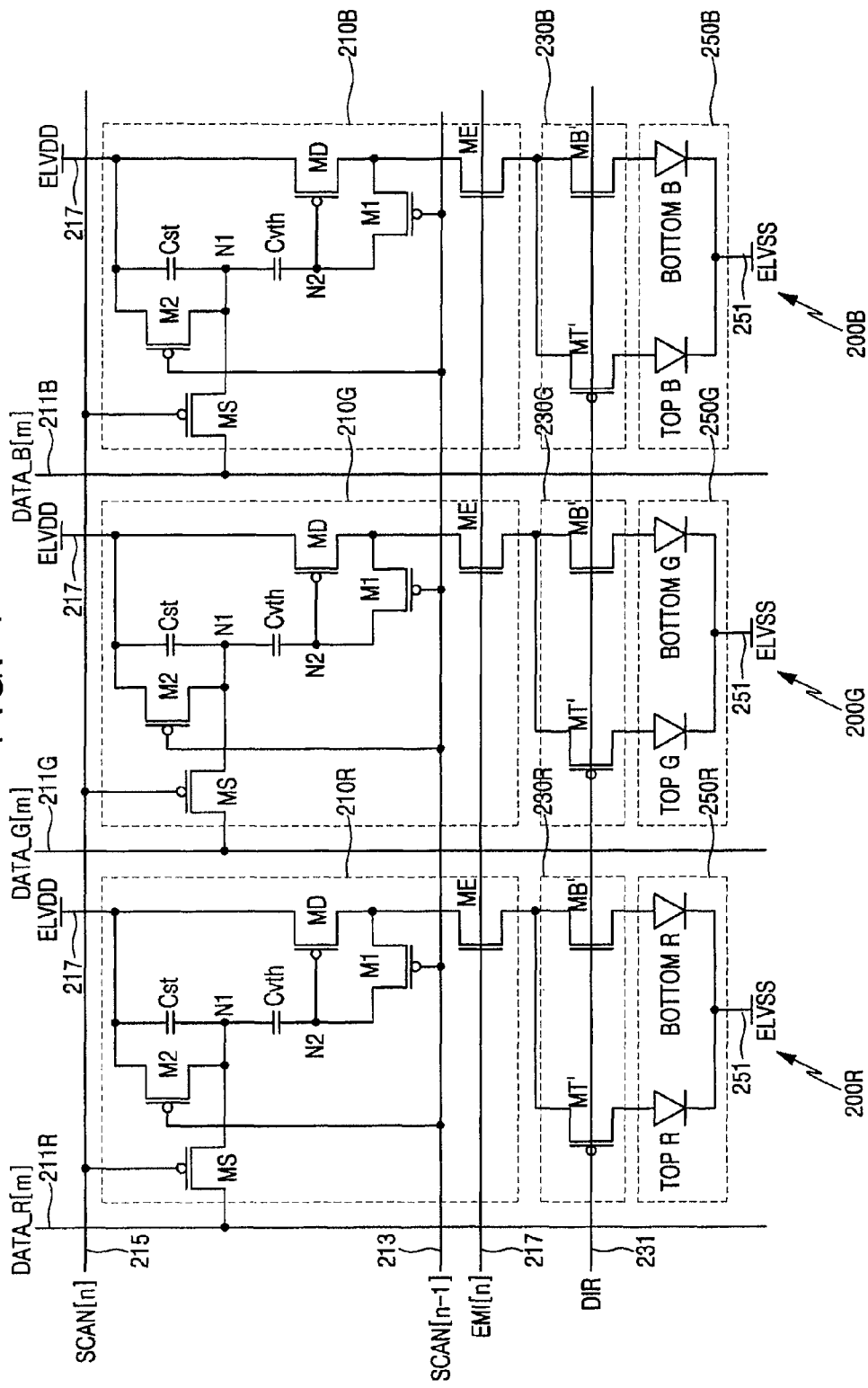
FIG. 4 is a circuit diagram of R, G, and B pixel circuits of a dual emission organic light emitting display device according to another embodiment of the present invention.

FIG. 4 is a circuit diagram of R, G, and B pixel circuits of a dual emission organic light emitting display device according to another embodiment of the present invention.

Referring to FIG. 4, one pixel circuit is divided into an R pixel circuit 200R, a G pixel circuit 200G, and a B pixel circuit 200B. Here, only the R pixel circuit 200R will be described in detail for ease of explanation.

The R pixel circuit 200R includes a pixel driver 210R, a top/bottom selector 230R, and an R OLED 250R.

The pixel driver 210R is enabled in response to a previous scan signal SCAN[n−1] and a current scan signal SCAN[n], receives an R data signal DATA_R[m] from a data line 211R, and generates a driving current. Also, the pixel driver 210R receives an emission control signal EMI[n] and allows or cuts off the flow of the driving current in response to the emission control signal EMI[n].

The top/bottom selector 230R allows the driving current to flow into a top R OLED or a bottom R OLED in response to a top/bottom selection signal DIR. Here, the top/bottom selection signal DIR is commonly applied to top/bottom selectors of all pixels.

Here, the R OLED 250R is divided into the top R OLED and the bottom R OLED. The top R OLED receives a top driving current selected by the top/bottom selector 230R and emits R light through a top surface, and the bottom R OLED receives a bottom driving current selected by the top/bottom selector 230R and emits R light through a bottom surface.

In the present embodiment, each pixel circuit of the dual emission organic light emitting display device may emit light through only one of the top surface or the bottom surface in response to the top/bottom selection signal DIR. In other words, an emission surface can be selectively determined, if required. Also, each pixel circuit includes a pixel driver and an OLED and applies the top/bottom selection signal DIR as a pulse type signal so that the same image can be displayed on both the top and bottom surfaces.

The components of the pixel driver 210R will now be described in more detail. The pixel driver 210R includes five transistors M1, M2, MS, MD, and ME and two capacitors Cst and Cvth. Specifically, a switching transistor MS is connected between the data line 211R and a node N1 and has a gate terminal connected to a current scan line 215. Thus, the switching transistor MS is turned on in response to a current scan signal SCAN[n] supplied from the current scan line 215 and transmits the R data signal DATA_R[m].

A driving transistor MD has a first electrode connected to a positive power supply voltage line 217 and a gate terminal connected to a node N2. The driving transistor MD generates a driving current corresponding to a voltage applied to the gate terminal thereof.

A threshold voltage compensation transistor M1 is connected between the gate terminal and a second electrode of the driving transistor MD and has a gate terminal connected to the previous scan line 213. The threshold voltage compensation transistor M1 is turned on in response to the previous scan signal SCAN[n−1] so that the driving transistor MD is diode-connected.

A power supply voltage application transistor M2 is connected between the positive power supply voltage line 217 and the node N1 and has a gate terminal connected to the previous scan line 213. The power supply voltage application transistor M2 is turned on in response to the previous scan signal SCAN[n−1] and transmits a positive power supply voltage ELVDD to the node N1.

A first capacitor Cst is connected between the positive power supply voltage line 217 and the node N1 and stores a voltage corresponding to a difference between the positive power supply voltage ELVDD and a data voltage.

A second capacitor Cvth is connected between the node N1 and the gate terminal of the driving transistor MD and stores the threshold voltage of the driving transistor MD.

An emission control transistor ME is connected between the second electrode of the driving transistor MD and the top/bottom selector 230R and has a gate terminal connected to the emission control line 217. The emission control transistor ME allows or cuts off the flow of the driving current in response to the emission control signal EMI[n].

The transistors M1, M2, MS, MD, and ME of the pixel driver 210R are shown as PMOS transistors. However, the present invention is not thereby limited. For example, the pixel driver 210R may be configured with NMOS transistors. Also, a circuit configuration of the pixel driver 210R is not limited to five transistors and two capacitors, and embodiments of the present invention may have any suitable configuration that can supply a driving current.

An operation of the pixel driver 210R will now be described in more detail. Here, when the previous scan signal SCAN[n−1] of a low level is applied, the threshold voltage compensation transistor M1 and the power supply voltage application transistor M2 are turned on. Thus, a positive power supply voltage ELVDD is applied to the node N1, and the driving transistor MD is diode-connected, so that a voltage of ELVDD−|Vth$_{MD}$|[V] is applied to the node N2. Accordingly, the second capacitor Cvth stores the same voltage as a threshold voltage Vth.

Next, when the current scan signal SCAN[n] of a low level is applied, the switching transistor MS is turned on and transmits a data voltage Vdata to the node N1. Here, since the second capacitor Cvth retains the same voltage as the threshold voltage Vth, a voltage at the node N2 (i.e., a gate voltage of the driving transistor MD) becomes ELVDD−|Vth$_{MD}$|−(ELVDD−Vdata) [V].

Then, when the emission control signal EMI[n] of a low level is applied, the emission control transistor ME is turned on and allows the flow of a driving current corresponding to a voltage applied to the gate terminal of the driving transistor MD.

Therefore, a driving current supplied from the driving transistor MD through the emission control transistor ME to the R OLED can be expressed by the above-described Equation 1.

Referring still to FIG. 4, the top/bottom selector 230R includes two transistors MT and MB'. That is, a top emission transistor MT' is connected between a second electrode of the emission control transistor ME and an anode of the top R OLED and has a gate terminal connected to a top/bottom selection line 231. The top emission transistor MT' is turned on/off in response to the top/bottom selection signal DIR and allows or cuts off the flow of the driving current.

A bottom emission transistor MB' is connected between the second electrode of the emission control transistor ME and an anode of the bottom R OLED and has a gate terminal connected to the top/bottom selection line 231. The bottom emission transistor MB' is turned on/off in response to the top/bottom selection signal DIR and allows or cuts off the flow of the driving current.

Here, gate terminals of the top and bottom emission transistors MT' and MB' are commonly connected to the top/bottom selection line 231 so that the on/off operations of the top emission transistor MT' and the bottom emission transistor MB' can be complementary to each other. Although it is illustrated in FIG. 4 that the top emission transistor MT' is a PMOS transistor and the bottom emission transistor MB' is an NMOS transistor, the present invention is not thereby limited. For example, the top emission transistor MT' may be an NMOS transistor and the bottom emission transistor MB' may be a PMOS transistor.

Referring still to FIG. 4, the R OLED 250R includes the top R OLED and the bottom R OLED.

That is, in one embodiment, as described with reference to FIG. 1, the top R OLED includes the top first electrode 30, which is an anode formed with the top reflective layer 25, the organic layer 50, and the second electrode 60, which is a cathode. Here, the anode 30 (or the top first electrode) 30 of the top R OLED is connected to a second electrode of the top emission transistor MT', and the cathode (or the second electrode) 60 is connected to a negative power supply voltage line (e.g., a reference or ground power supply voltage line) 251.

Also, in one embodiment, as described with reference to FIG. 1, the bottom R OLED includes the bottom first electrode 31, which is an anode, the organic layer 50, and the second electrode 60, which is a cathode formed with the bottom reflective layer 70. The anode (or the bottom first electrode) 31 of the bottom R OLED is connected to a second electrode of the bottom emission transistor MB', and the cathode (or the second electrode) 60 is connected to the negative power supply voltage line 251.

As described above, the dual emission organic light emitting display device of the present embodiment includes a single pixel driver and a single OLED (e.g., having a top OLED and a bottom OLED with a shared organic layer) and can emit light through only one of the top surface or the bottom surface in response to a top/bottom selection signal, if desired. Also, the dual emission organic light emitting display device of the present embodiment can apply the top/bottom selection signal as a pulse type signal so that the same image can be displayed on both the top and bottom surfaces.

A method of driving the above-described organic light emitting display device will now be described in more detail with reference to FIGS. 5 and 6.

Figure 5:
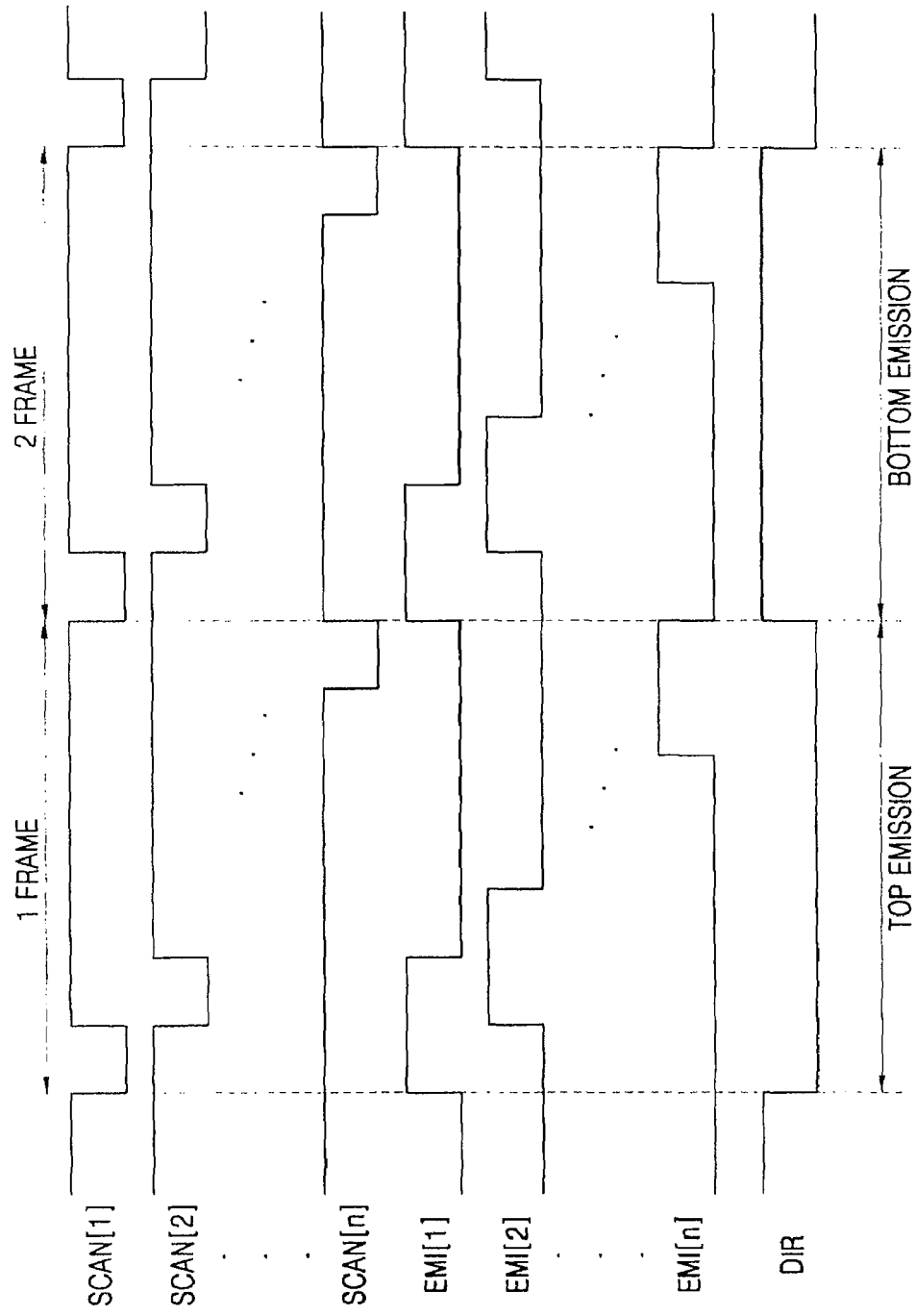
FIG. 5 is a timing diagram illustrating a first method of driving the pixel circuit of FIG. 4.

FIG. 5 is a timing diagram illustrating a first method of driving the pixel circuit of FIG. 4.

Referring to FIG. 5, for a 1$^{st}$ frame, scan signals SCAN[1] to SCAN[n] and emission control signals EMI[1] to EMI[n] are sequentially applied to pixel drivers 210R, 210G, and 210B, and data signals DATA_R[1] to DATA_R[m] are applied to corresponding pixels, and thus a driving current (which may be predetermined) flows through the pixel drivers 210R, 210G, and 210B.

In this case, a top/bottom selection signal DIR that is commonly applied to top/bottom selectors 230R, 230G, and 230B is dropped to a low level. Thus, the top emission transistor MT' is turned on, and the bottom emission transistor MB' is turned off, so that the driving current flows into top OLEDs to display an image on the top surface.

Next, for a 2$^{nd}$ frame, the scan signals SCAN[1] to SCAN[n] and the emission control signals EMI[1] to EMI[n] are sequentially applied to the pixel drivers 210R, 210G, and 210B, and the data signals DATA_R[1] to DATA_R[m] are applied to the corresponding pixels, and thus a driving current (which may be predetermined) flows through the pixel drivers 210R, 210G, and 210B.

In this case, the top/bottom selection signal DIR that is commonly applied to the top/bottom selectors 230R, 230G, and 230B is elevated to a high level. Thus, the top emission transistor MT' is turned off, and the bottom emission transistor MB' is turned on, so that the driving current flows into bottom OLEDs to display an image on the bottom surface.

As described above, the pixel circuit of the dual emission organic light emitting display device of the present embodiment includes a single pixel driver and an OLED so that the same image can be displayed on the top surface or the bottom surface, if desired, using the top/bottom selector.

Figure 6:
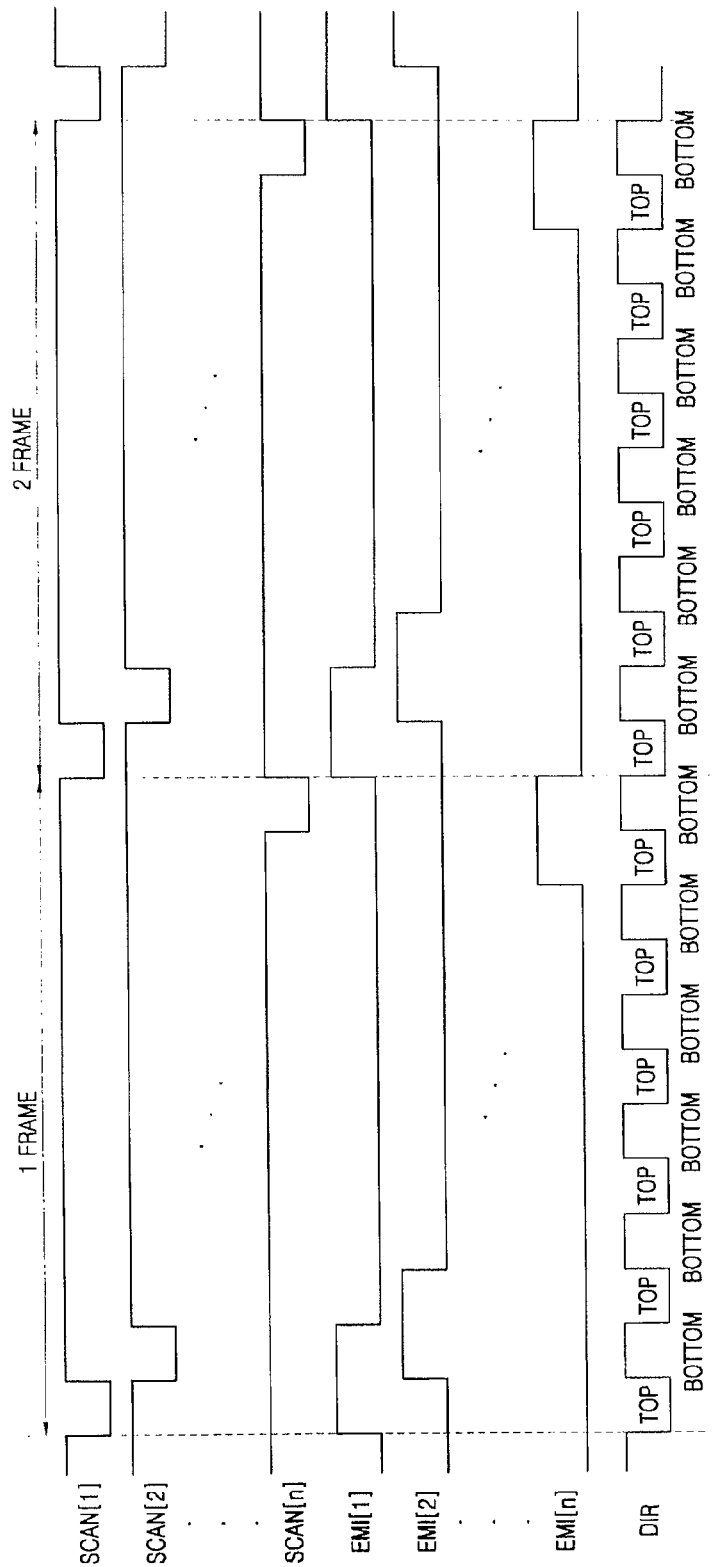
FIG. 6 is a timing diagram illustrating a second method of driving the pixel circuit of FIG. 4.

FIG. 6 is a timing diagram illustrating a second method of driving the pixel circuit of FIG. 4.

Referring to FIG. 6, for each frame, scan signals SCAN[1] to SCAN[n] and emission control signals EMI[1] to EMI[n] are sequentially applied to the pixel drivers 210R, 210G, and 210B, and data signals DATA_R[1] to DATA_R[m] are applied to corresponding pixels, and thus a driving current (which may be predetermined) flows through the pixel drivers 210R, 210G, and 210B.

In this case, a pulse-type top/bottom selection signal DIR, which alternates between a low level and a high level in a certain or predetermined cycle, is commonly applied to the top/bottom selectors 230R, 230G, and 230B. The pulse-type top/bottom selection signal DIR has a duty ratio of 50%. This leads the top and bottom surfaces to emit light for the same time, thus making luminance uniform. Accordingly, the top and bottom emission transistors MT and MB' are repeatedly and alternately turned on/off in response to the top/bottom selection signal DIR to repeatedly and alternately flow the driving current into the top and bottom OLEDs so that the same image can be displayed on the top and bottom surfaces.

As described above, the pixel circuit of the dual emission organic light emitting display device of the present embodiment includes a single pixel driver and a single OLED and can display the same image on both the top and bottom surfaces in a time-division manner using the pulse-type top/bottom selection signal. In this case, since the top and bottom OLEDs are sequentially driven in a very short amount of time, a user perceives the top and bottom OLEDs to emit light at the same time. Therefore, the same image can be normally displayed on both the top and bottom surfaces.

In the present embodiment, one OLED is divided into the top OLED and the bottom OLED, which have a pixel driver in common. Thus, an image is displayed on only one of the top surface or the bottom surface, if desired, by controlling a top/bottom selection signal. Alternatively, the same image can be displayed in a time-division manner on both the top and bottom surfaces using a pulse-type top/bottom selection signal. As a result, the circuit configuration of the pixel driver is reduced by half, and thus the dual emission organic light emitting display device can be improved in terms of a layout, an interconnection, and an aperture ratio.

According to an embodiment of the present invention as described above, a single OLED is divided into a top OLED and a bottom OLED, which have a pixel driver in common. Thus, the circuit configuration of the pixel driver is reduced by half so that a dual emission organic light emitting display device can be improved in terms of a layout, an interconnection, and an aperture ratio.

Also, since the dual emission organic light emitting display device can be driven by a TDC method by dividing one frame into a top emission frame and a bottom emission frame, different images can be displayed on a top surface and a bottom surface.

Further, the dual emission organic light emitting display device can control a top/bottom selection signal to display an image on one of the top surface or the bottom surface, if desired. Alternatively, the dual emission organic light emitting display device can apply the top/bottom selection signal as a pulse type signal so that the same image can be displayed in a time-division manner on both the top and bottom surfaces.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A dual emission organic light emitting display device comprising:
   a pixel circuit comprising:
      a pixel driver configured to generate a driving current in response to a data signal;
      a top/bottom selector configured to receive the driving current from the pixel driver and to selectively supply the driving current for top emission or for bottom emission in response to a top/bottom selection signal; and
      a dual emission organic light emitting diode configured to selectively receive the driving current from the top/bottom selector and to emit light for top emission through a top surface of the display device or for bottom emission through a bottom surface of the display device.

2. The dual emission organic light emitting display device according to claim 1, wherein the top/bottom selector comprises:
   a top emission transistor connected between the pixel driver and a top anode of the dual emission organic light emitting diode and configured to turn on or off in response to the top/bottom selection signal; and
   a bottom emission transistor connected between the pixel driver and a bottom anode of the dual emission organic light emitting diode and configured to turn on or off in response to the top/bottom selection signal.

3. The dual emission organic light emitting display device according to claim 2,
   wherein the top and bottom emission transistors are metal oxide semiconductor (MOS) transistors having different charge carrier types, and
   wherein the top and bottom emission transistors are configured to perform complementary on/off operations in response to the top/bottom selection signal.

4. The dual emission organic light emitting display device according to claim 3, wherein the dual emission organic light emitting display device is configured to commonly apply the top/bottom selection signal to the top/bottom selector of each of a plurality of pixel circuits of the dual emission organic light emitting display device.

5. The dual emission organic light emitting display device according to claim 4,
   wherein the top/bottom selection signal is a pulse-type signal with a certain cycle, and
   wherein the pulse-type signal has a duty ratio of 50%.

6. The dual emission organic light emitting display device according to claim 5, wherein the dual emission organic light emitting diode is configured to display a same image on both the top and bottom surfaces of the display device.

7. The dual emission organic light emitting display device according to claim 6, wherein the pixel driver comprises:
   a switching transistor connected between a data line and a first node and adapted to apply the data signal in response to a current scan signal transmitted through a gate terminal thereof;
   a driving transistor connected between a first power supply voltage line and the top/bottom selector and adapted to generate the driving current in accordance with a voltage at a second node connected to a gate terminal thereof;
   a threshold voltage compensation transistor connected between the gate terminal and a drain terminal of the driving transistor and adapted to diode-connect the driving transistor in response to a previous scan signal;
   a power supply voltage application transistor connected between the first power supply voltage line and the first node and adapted to apply a first power supply voltage to the first node in response to the previous scan signal;
   a first capacitor connected between the first power supply voltage line and the first node and adapted to store a voltage corresponding to a difference between the first power supply voltage and a voltage of the data signal;
   a second capacitor connected between the first node and the gate terminal of the driving transistor and adapted to store a voltage corresponding to a threshold voltage of the driving transistor; and
   an emission control transistor connected between the drain terminal of the driving transistor and the top/bottom selector and adapted to allow or cut off a flow of the driving current in response to an emission control signal transmitted through a gate terminal thereof.

8. The dual emission organic light emitting display device according to claim 2, wherein the pixel driver comprises:
   a switching transistor connected between a data line and a first node, and comprising a gate terminal configured to receive a current scan signal, the switching transistor configured to apply the data signal in response to the current scan signal;
   a driving transistor connected between a first power supply voltage line and the top/bottom selector, and comprising a gate terminal connected to a second node, the driving transistor configured to generate the driving current in accordance with a voltage at the second node;

a threshold voltage compensation transistor connected between the gate terminal and a drain terminal of the driving transistor, and comprising a gate terminal configured to receive a previous scan signal, the threshold voltage compensation transistor configured to diode-connect the driving transistor in response to the previous scan signal;

a power supply voltage application transistor connected between the first power supply voltage line and the first node, and comprising a gate terminal configure to receive the previous scan signal, the power supply voltage application transistor configured to apply a first power supply voltage to the first node in response to the previous scan signal;

a first capacitor connected between the first power supply voltage line and the first node, and configured to store a voltage corresponding to a difference between the first power supply voltage and a voltage of the data signal;

a second capacitor connected between the first node and the gate terminal of the driving transistor, and configured to store a voltage corresponding to a threshold voltage of the driving transistor; and an emission control transistor connected between the drain terminal of the driving transistor and the top/bottom selector, and comprising a gate terminal configured to receive an emission control signal, the emission control transistor configured to allow or cut off a flow of the driving current in response to the emission control signal.

9. A dual emission organic light emitting display device comprising:

a pixel driver adapted to generate a driving current in response to a data signal;

a top/bottom selector adapted to receive the driving current from the pixel driver and to selectively supply the driving current in response to a top/bottom selection signal; and a dual emission organic light emitting diode adapted to selectively receive the driving current from the top/bottom selector and to emit light through one of a top surface of the display device or a bottom surface of the display device, wherein the top/bottom selector comprises:
a top emission transistor connected between the pixel driver and a top anode of the dual emission organic light emitting diode and adapted to turn on or off in response to the top/bottom selection signal; and
a bottom emission transistor connected between the pixel driver and a bottom anode of the dual emission organic light emitting diode and adapted to turn on or off in response to the top/bottom selection signal, wherein the top and bottom emission transistors are MOS transistors having different charge carrier types, wherein the top and bottom emission transistors are adapted to perform complementary on/off operations in response to the top/bottom selection signal, wherein the top/bottom selection signal is commonly applied to the top/bottom selectors of all pixels of the dual emission organic light emitting display device, wherein the top/bottom selection signal is a pulse-type signal with a certain cycle, and wherein the pulse-type signal has a duty ratio of 50%.

10. The dual emission organic light emitting display device according to claim 9, wherein the dual emission organic light emitting diode displays the is configured to display a same image on both the top and bottom surfaces of the display device.

11. The dual emission organic light emitting display device according to claim 10, wherein the pixel driver comprises:

a switching transistor connected between a data line and a first node and adapted to apply the data signal in response to a current scan signal transmitted through a gate terminal thereof;

a driving transistor connected between a first power supply voltage line and the top/bottom selector and adapted to generate the driving current in accordance with a voltage at a second node connected to a gate terminal thereof;

a threshold voltage compensation transistor connected between the gate terminal and a drain terminal of the driving transistor and adapted to diode-connect the driving transistor in response to a previous scan signal;

a power supply voltage application transistor connected between the first power supply voltage line and the first node and adapted to apply a first power supply voltage to the first node in response to the previous scan signal;

a first capacitor connected between the first power supply voltage line and the first node and adapted to store a voltage corresponding to a difference between the first power supply voltage and a voltage of the data signal;

a second capacitor connected between the first node and the gate terminal of the driving transistor and adapted to store a voltage corresponding to a threshold voltage of the driving transistor; and an emission control transistor connected between the drain terminal of the driving transistor and the top/bottom selector and adapted to allow or cut off a flow of the driving current in response to an emission control signal transmitted through a gate terminal thereof.

* * * * *

UNITED STATES PATENT AND TRADEMARK OFFICE
CERTIFICATE OF CORRECTION

| | | |
|---|---|---|
| PATENT NO. | : 8,049,240 B2 | Page 1 of 1 |
| APPLICATION NO. | : 12/690016 | |
| DATED | : November 1, 2011 | |
| INVENTOR(S) | : Jin-Woo Park et al. | |

It is certified that error appears in the above-identified patent and that said Letters Patent is hereby corrected as shown below:

Column 15, Claim 8, line 10.    Delete "configure"

Insert -- configured --

Column 16, Claim 10, line 16.    Delete "displays the"

Signed and Sealed this
Twenty-third Day of October, 2012

David J. Kappos
*Director of the United States Patent and Trademark Office*